(12) United States Patent
Bulur et al.

(10) Patent No.: US 9,529,058 B2
(45) Date of Patent: Dec. 27, 2016

(54) TESTING A MULTI-PHASE VOLTAGE REGULATOR MODULE

(71) Applicant: International Business Machines Corporation, Armonk, NY (US)

(72) Inventors: Yakup Bulur, Rochester, MN (US); Marc Coq, Hopewell Junction, NY (US); Richard J. Fishbune, Rochester, MN (US); Eric B. Swenson, Pine Island, MN (US)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 14/256,210

(22) Filed: Apr. 18, 2014

(65) Prior Publication Data

US 2015/0301124 A1 Oct. 22, 2015

(51) Int. Cl.
G01R 31/20 (2006.01)
G01R 31/40 (2014.01)
G01R 31/02 (2006.01)

(52) U.S. Cl.
CPC ............. *G01R 31/40* (2013.01); *G01R 31/025* (2013.01)

(58) Field of Classification Search
CPC . G01R 31/40; G01R 31/2886; G01R 31/2831; G01R 1/07314
USPC ........................................ 324/754.03, 754.01
See application file for complete search history.

(56) References Cited

U.S. PATENT DOCUMENTS

| | | | |
|---|---|---|---|
| 4,115,731 A | 9/1978 | Axtell, III | |
| 4,377,782 A | 3/1983 | Metcalf et al. | |
| 6,191,499 B1 * | 2/2001 | Severson | G06F 1/26 307/31 |
| 6,839,873 B1 | 1/2005 | Moore | |
| 7,130,340 B1 * | 10/2006 | Jong | H04B 3/46 375/227 |
| 2003/0085715 A1 | 5/2003 | Lubkeman et al. | |
| 2004/0215991 A1 * | 10/2004 | McAfee | G06F 1/30 713/324 |

(Continued)

FOREIGN PATENT DOCUMENTS

| | | | |
|---|---|---|---|
| CN | 101707389 A | 5/2010 | |
| CN | 102401872 A | 4/2012 | |

(Continued)

OTHER PUBLICATIONS

Pontarelli et al., "Self Checking Circuit Optimization by means of Fault Injection Analysis: A Case Study on Reed Solomon Decoders", 13th IEEE International On-Line Testing Symposium (IOLTS 2007), pp. 194-196, © 2007 IEEE. DOI: 10.1109/IOLTS.2007.58.

(Continued)

*Primary Examiner* — Tung X Nguyen
*Assistant Examiner* — Dominic Hawkins
(74) *Attorney, Agent, or Firm* — Jared L. Montanaro

(57) ABSTRACT

Low-impedance pins are electrically connected to a set of corresponding nodes of a multi-phase VRM. The multi-phase VRM is activated. A failure condition is induced in a phase of the multi-phase VRM by modifying operating parameters of the phase of the multi-phase VRM using the set of low-impedance pins. The output signal of the multi-phase VRM is monitored in response to the induced failure condition.

20 Claims, 5 Drawing Sheets

(56) References Cited

U.S. PATENT DOCUMENTS

| | | | | |
|---|---|---|---|---|
| 2004/0267483 | A1* | 12/2004 | Percer | G01R 31/3173 |
| | | | | 702/118 |
| 2005/0283686 | A1* | 12/2005 | Dart | G11C 5/147 |
| | | | | 714/54 |
| 2006/0087322 | A1 | 4/2006 | McCollough, Jr. | |
| 2006/0242446 | A1* | 10/2006 | Hanamori | G06F 1/06 |
| | | | | 713/500 |
| 2007/0259538 | A1* | 11/2007 | Brodsky | H05K 3/368 |
| | | | | 439/66 |
| 2009/0295357 | A1* | 12/2009 | Lin | H02M 3/157 |
| | | | | 323/285 |
| 2010/0148791 | A1 | 6/2010 | Oldenburg et al. | |
| 2011/0072317 | A1* | 3/2011 | Adachi | G06F 1/26 |
| | | | | 714/48 |
| 2011/0234307 | A1 | 9/2011 | Marinet et al. | |
| 2014/0268461 | A1* | 9/2014 | Jeong | H02H 3/08 |
| | | | | 361/87 |
| 2015/0003015 | A1* | 1/2015 | Kulkarni | H05K 7/1432 |
| | | | | 361/700 |

FOREIGN PATENT DOCUMENTS

| | | |
|---|---|---|
| CN | 101707389 B | 11/2012 |
| WO | 9850856 A1 | 11/1998 |

OTHER PUBLICATIONS

Vargas et al., "Estimating Circuit Fault-Tolerance by Means of Transient-Fault Injection in VHDL", Proceedings of the 6th IEEE International On-Line Testing Workshop, 2000, pp. 67-72, © 2000 IEEE. DOI: 10.1109/OLT.2000.856614.

* cited by examiner

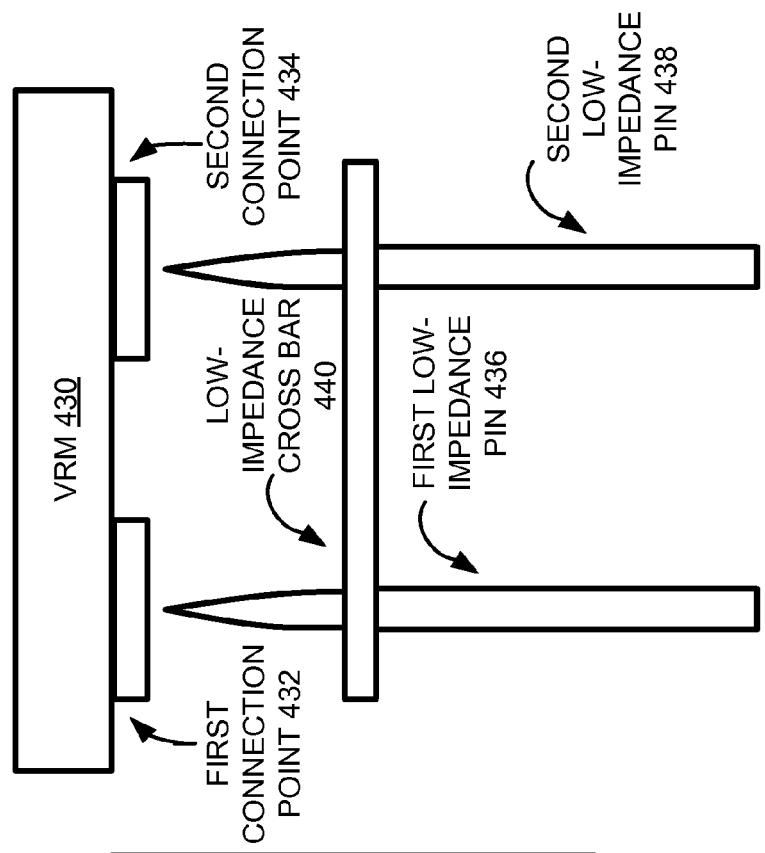
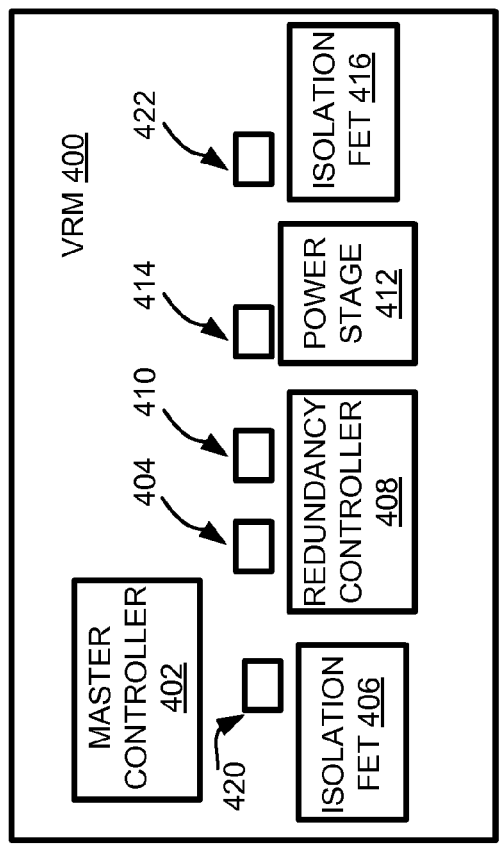
FIG. 4A
FIG. 4B

TESTING A MULTI-PHASE VOLTAGE REGULATOR MODULE

BACKGROUND

The present disclosure relates to voltage regulator modules (VRMs), and more specifically, to testing the functionality of a multi-phase VRM.

A VRM can convert a voltage at one potential to a voltage at another potential. The conversion can be necessary because many chips do not operate at the voltage potential supplied by a voltage source. Therefore, VRMs can be used to change the voltage potential to a level that is operable. Furthermore, a VRM can be used to provide a constant DC output voltage as well as providing enough current to a chip.

SUMMARY

According to embodiments of the present disclosure, a method for testing functionality of a multi-phase voltage regulator module (VRM). In various embodiments, the method can include connecting, electrically, a set of low-impedance pins to a set of corresponding nodes of a multi-phase VRM. The method can also include activating the multi-phase VRM. Also, the method can include inducing a failure condition in a phase of the multi-phase VRM by modifying operating parameters of the phase of the multi-phase VRM using the set of low-impedance pins. Furthermore, the method can include monitoring an output signal of the multi-phase VRM in response to the induced failure condition.

According to embodiments of the present disclosure, a system for testing functionality of a multi-phase voltage regulator module (VRM). In various embodiments, the system can include a set of low-impedance pins configured to connect, electrically, to a set of corresponding nodes of a multi-phase VRM. The set of low-impedance pins can also be configured to induce a failure condition in a phase of the multi-phase VRM, when the multi-phase VRM has been activated, by modifying operating parameters of the phase of the multi-phase VRM. Furthermore, the system can include a detection circuit configured to monitor an output signal of the activated multi-phase VRM in response to the induced failure condition.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 4A depicts an example of a VRM configured to receive failure inducing conditions, consistent with embodiments of the present disclosure.

FIG. 4B depicts an example of low-impedance pins and a cross bar configured to establish a short circuit, consistent with embodiments of the present disclosure.

Figure 1:
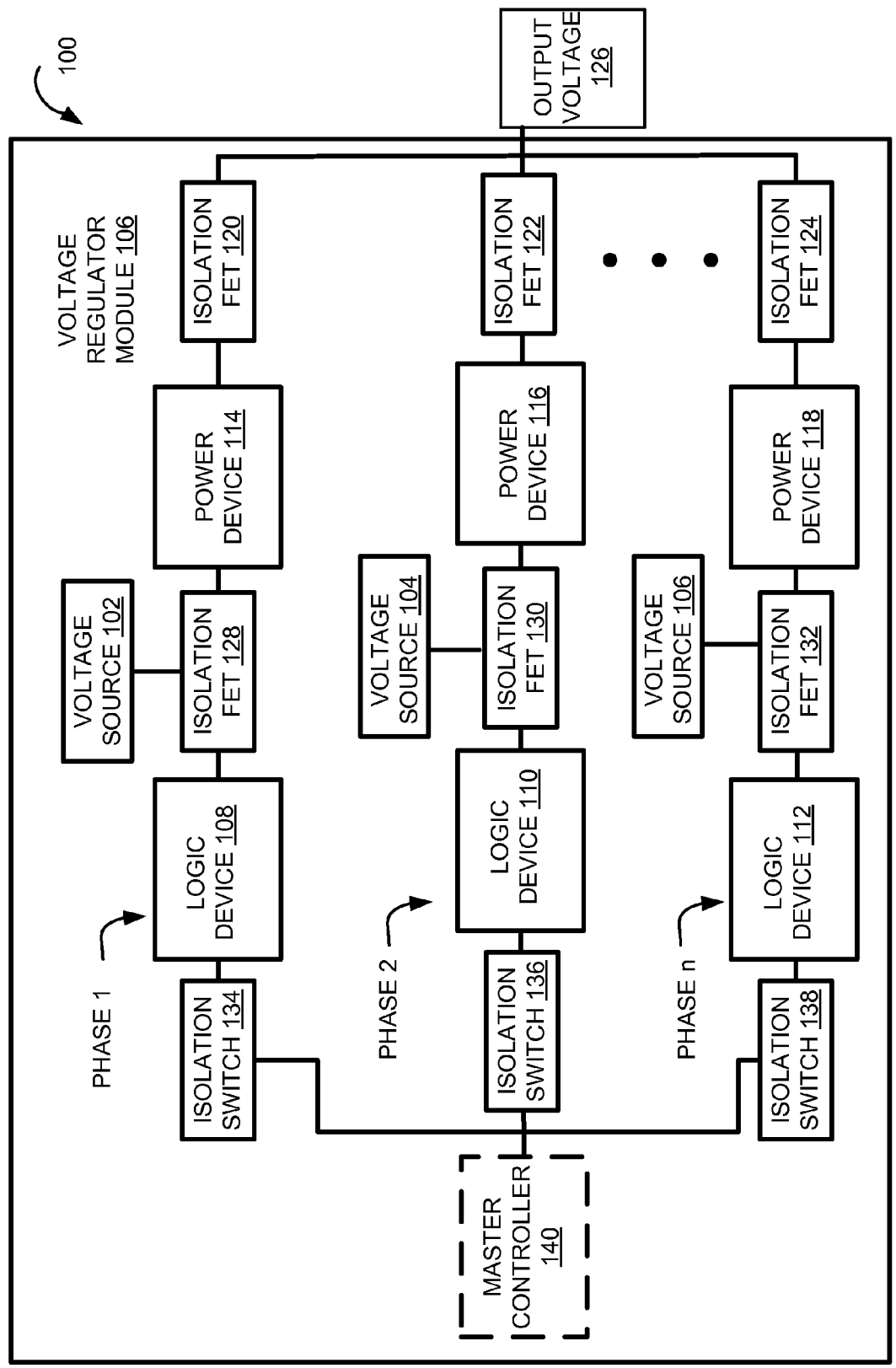
FIG. 1 depicts a high level example circuit illustrating the operation of a VRM, consistent with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to voltage regulator modules (VRMs), more particular aspects relate to testing the functionality of a multi-phase VRM. While the present disclosure is not necessarily limited to such applications, various aspects of the disclosure may be appreciated through a discussion of various examples using this context.

VRMs can be configured with multiple phases, where each phase can provide a portion of the regulated power for the entire VRM. The multiple phases can be beneficial because a VRM can be responsible for supplying a chip with a lot of current. The fewer phases used in a VRM assembly, the more current there is that runs through each phase. This can cause circuit elements of a phase to overheat and increase the likelihood of the VRM malfunctioning. When multiple phases are used, the current can be divided so less current is carried by individual phase, or total current is carried by each individual phase for less time, thus, decreasing the likelihood that the circuit elements of a phase can overheat and cause the VRM to malfunction. To test that a VRM can operate properly if the number of phases is decreased, each individual phase can be turned off. When a phase is turned off, the total current is now divided amongst the remaining phases.

Aspects of the present disclosure are directed toward a test system (and correspondingly configured VRM) that is configured to emulate different failure conditions for the phases of the VRM and to determine whether or not the VRM correctly compensates for the failure conditions. As discussed herein, various embodiments include a set of pins configured to connect to a set of test contact points on the VRM device. For instance, the test system can be designed to function as an in-circuit test (ICT) device with electrical probes that connect to VRM located on a populated printed circuit board (PCB). In addition to being able to check for correct fabrication (e.g., shorts, opens, resistance, inductance and capacitance), the test system can be configured to power the VRM and to inject signals using the pins. These signals can emulate different failures or problems. In some embodiments, the test system can include a bed of nails type test fixture.

Embodiments of the present invention will now be described more fully hereinafter with reference to the accompanying figures. However, this invention may be embodied in many different forms and should not be construed as limited to the embodiments set forth. The embodiments disclosed are provided so that this disclosure may fully convey the scope of the invention to those skilled in the art. Therefore, the following detailed description is not to be taken in a limiting sense.

FIG. 1 depicts a high level example circuit 100 illustrating the operation of a VRM, consistent with embodiments of the present disclosure. As shown, the circuit 100 can include a multi-phase VRM 106 and an output voltage 126. The multi-phase VRM 106 can be configured to include voltage sources 102, 104, 106, an optional master controller 140, isolation switches 134, 136, 138, logic devices 108, 110, 112, isolation FETs 120, 122, 124, 128, 132, and power devices 114, 116, 118. In FIG. 1, the master controller is shown to be inside the VRM 106, however, the master controller can also be outside the VRM and there can also multiple master controllers within the VRM.

Embodiments of the present disclosure are directed toward testing VRMs by injecting signals that emulate failure conditions in one or more phases of the VRMs. As discussed herein, the VRM 106 can include a set of test points that are accessible to pins of the test system. These tests points can be electrically connected to nodes within the VRM that are electrically connected to the VRM elements. By connecting the pins to the test points, failure conditions can be induced within the VRM. Such failure conditions can be induced by shorts between internal circuit nodes (e.g., a short between the VRM output and an input voltage source), noise signals transmitted at a node between VRM elements (e.g. noise between a master controller 140 and a logic device 108), and shorts at critical communication paths between VRM elements (e.g. a short between a master controller 140 and a logic device 108).

In various embodiments, when a failure condition is induced by modifying operating parameters within a phase of the VRM, the logic devices (e.g. logic devices 108, 110, and 112) can be tested whether they disconnect their given phase from the VRM. For example, the VRM 106 can be configured to operate similar to a redundant direct current to direct current (DC/DC) converter module. The master controller 104 can provide logic that determines how current flowing to the VRM is divided amongst the multiple phases within a VRM. For instance, within the VRM 106, there can be ten phases and there can be 80 amperes of total current flowing through circuit 100. The master controller can be responsible for evenly distributing the total current between the ten phases so that 8 amperes of current flow through each phase.

A failure condition can be induced in phase 1 of the VRM 106. The failure condition can be a short circuit established between nodes electrically connected to the voltage source 102 and ground (not shown in FIG. 1). For instance, a set of low-impedance pins (not shown in FIG. 1) can be electrically connected at the first node that is electrically connected to voltage source 102. Also, the set of low-impedance pins can be electrically connected to a second node this is electrically connected to ground. Furthermore, a low-impedance cross bar can electrically connect the set of low-impedance pins to establish the short circuit between the first and second node.

A VRM, e.g. VRM 106, can be configured as a closed-loop system. In control theory, for a closed-loop system, a sensor monitors the system output and feeds data to a controller which adjusts the control as necessary to maintain the desired system output. For instance, the master controller 140 can act as a sensor that monitors the VRM output voltage 126. The master controller 140 can be configured to distribute current amongst phase 1-phase n. In addition, the master controller 202 can be configured to maintain an output voltage 126 with an acceptable error. If the output voltage does not stay within this range, the master controller must adjust the control so the output voltage falls back within the accepted range. If the output voltage does not fall back within the accepted range, it can be determined that there is a fault within the VRM.

When the short circuit is established the master controller can detect that the output voltage is outside the accepted range. The master controller can then determine that the output voltage is exceeding the regulated range because of the short circuit. The master controller can then instruct the logic device 108 to disconnect phase 1 from the VRM by opening the isolation switch 134 and activating the isolation FETs 128 and 120. The master controller can then distribute current evenly amongst the nine phases still connected within the VRM. The master controller can then monitor the output voltage 126 to determine if the output voltage falls back within the regulated range. If the output voltage does fall back within the regulated range, the master controller can continue distributing the current accordingly to the nine phases. If the output voltage does not fall back within the regulated range, the master controller can redistribute the current amongst the nine phases and then determine if the output voltage falls back within the regulated range.

In another embodiment, the VRM can be configured so the master controller distributes current between phase 1-phase n for a set amount of time. For instance, the master controller can distribute current so that each phase carries the total current for an equal amount of time. If a short circuit is established the master controller can detect that the output voltage is outside the accepted range. The master controller can then determine that the output voltage is exceeding the regulated range because of the short circuit. The master controller can then instruct the logic device 108 to disconnect phase 1 from the VRM by opening the isolation switch 134 and activating the isolation FETs 128 and 120. Once again, if there were ten phases to begin with, the master controller can then distribute total current for equal amounts time amongst the nine phases still connected within the VRM. The master controller can then monitor the output voltage 126 to determine if the output voltage falls back within the regulated range. If the output voltage does fall back within the regulated range, the master controller can continue distributing the current for equal amounts of time to the nine phases. If the output voltage does not fall back within the regulated range, the master controller can change the amount of time current is carried by each phase in the remaining nine phases and then determine if the output voltage falls back within the regulated range.

These are only two examples of testing and monitoring a VRM. Other failure inducing conditions, nodes, and output signals can be used to test and monitor the VRM. For instance, a noise signal can act as the failure inducing condition that modifies the operating parameters of phase 1 and it can be transmitted at a node electrically connecting the logic device 108 and the power device 114. The current can then be monitored as the output signal to determine if the logic device 108 opened the isolation switch 134 and activated isolation FETs 128 and 120 to disconnect phase 1 from the VRM. In addition, it can be determined that other VRM elements are malfunctioning such as the master controller 140 and power devices 114, 116, 118 based upon the output signal. Furthermore, other phases can be tested and monitored to determine whether the VRM elements in those phases are working properly. Various embodiments also allow for there to be different distributions of power between the phases (e.g. phase 1 can provide more current than phase 2 or for a greater amount of time).

Figure 2:
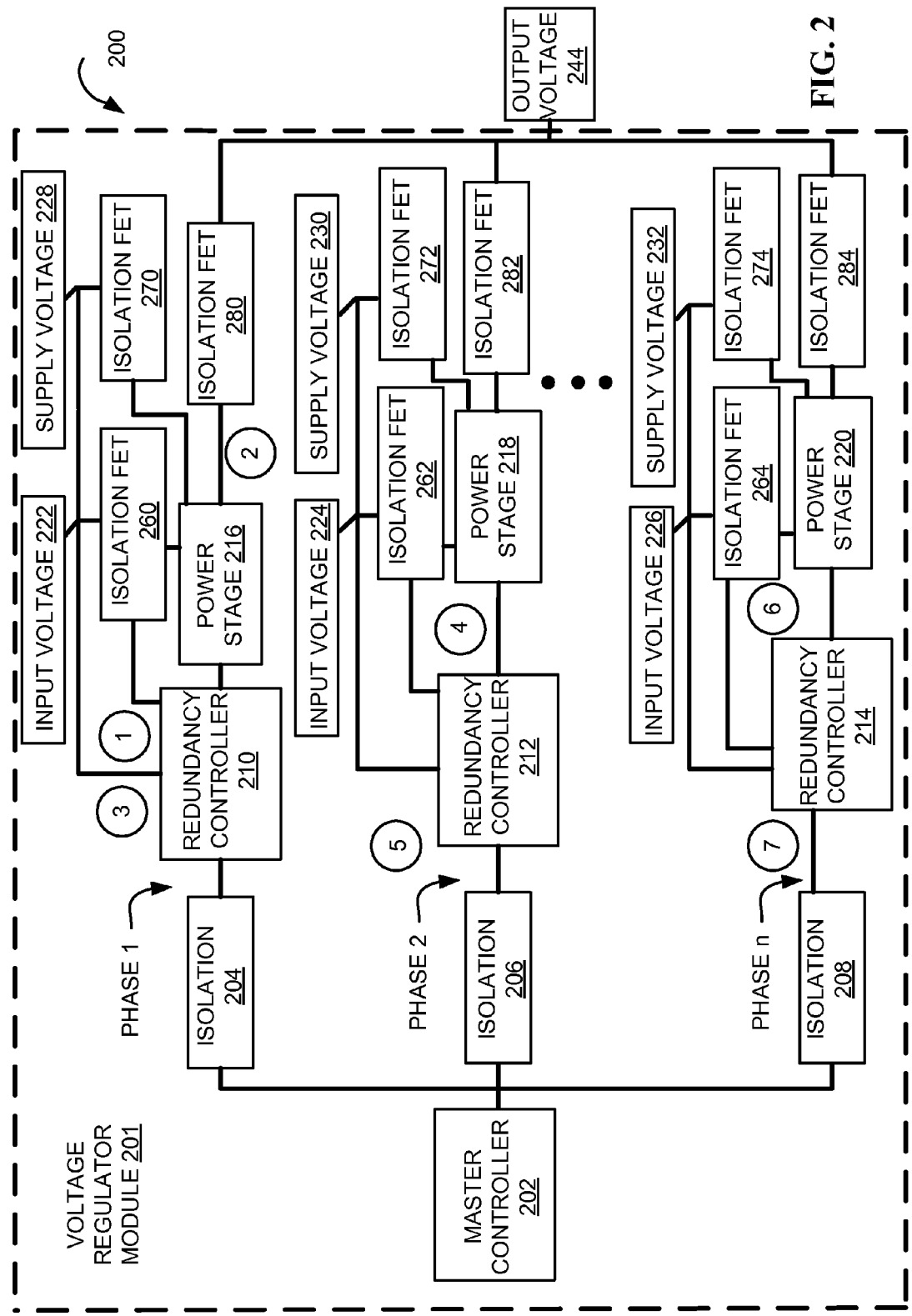
FIG. 2 depicts an example of a circuit with a multi-phase VRM capable of receiving failure inducing conditions, consistent with embodiments of the present disclosure.

FIG. 2 depicts an example of a circuit 200 with a multi-phase VRM capable of receiving failure inducing conditions, consistent with embodiments of the present disclosure. As shown, the circuit 200 can include a multi-phase VRM 201 and output voltage 244. The VRM can be configured to include input voltages 222, 224, 226, control voltages 228, 230, 232, a master controller 202, isolation switches 204, 206, 208, redundancy controllers 210, 212, 214, power stages 216, 218, 220, and isolation FETs 260, 262, 264, 270, 272, 274, 280, 282, 284.

Input voltage 222, 224, 226 and control voltages 228, 230, 232 can be configured to operate similar to voltage sources 102, 104, 106 from FIG. 1. Master controller 202 can be configured to operate similar to master controller 140 from FIG. 1. Redundancy controllers 210, 212, and 214 can be configured to operate similar to logic devices 108, 110, and 112 from FIG. 1. Power stages 216, 218, and 220 can be configured to operate similar to power devices 114, 116, and 118 from FIG. 1. Isolation switches 204, 206 and 208 can be configured to operate similar to isolation switches 134, 136, and 138 from FIG. 1. Isolation FETs 260, 262, 264, 270, 272, 274, 280, 282, and 284 can be configured to operate similar to isolation FETs 120, 122, 124, 128, 130, and 132 from FIG. 1. Output voltage 244 can be configured to operate similar to output voltage 126 from FIG. 1.

The master controller 202 can be configured to distribute current between phase 1-phase n for a set amount of time. For instance, the master controller 202 can distribute current so that each phase carries the total current for an equal amount of time. The phases can be of similar design so that when the total current is distributed for an equal amount of time, each phase will supply the same amount of power. However, this is just one example of current distribution and the master controller can distribute current so that some phases carry the total current for longer periods of time than other phases. Furthermore, the master controller 202 can be configured to maintain an output voltage 244 of 1.3 V with an error of ±0.5%.

As illustrated, location 1 in phase 1 of FIG. 2, is a node that is electrically connected to input voltage 222 and can be the first node where the set of low-impedance pins are electrically connected. The failure inducing condition that modifies operating parameters of a phase can be a short circuit. When a short circuit is established between location 1 and a second node electrically connected to ground, the voltage supplied to regulator 1 reduces to 0 V. Consequentially, the output voltage 244 can be read by a detection circuit and can exceed the regulated range of 1.3V±0.5%. The master controller 202 can monitor the output voltage 244 and recognize that the output voltage has exceeded the regulated range. The master controller can then determine that the output voltage is exceeding the regulated range because the input voltage 222 is 0 V. The master controller can then instruct the redundancy controller 210 to disconnect phase 1 from the VRM 201 by opening the isolation switch 204 and activating the isolation FETs 260, 270, and 280. The master controller can then distribute the total current for an equal amount of time amongst the phases still connected within the VRM, i.e. phase 2-phase n. The master controller can then monitor the output voltage to determine if the output voltage falls back within the regulated range. If the output voltage does fall back within the regulated range, the master controller can continue distributing the current accordingly to the remaining phases. If the output voltage does not fall back within the regulated range, the master controller can redistribute the total current amongst the remaining phases and then determine if the output voltage falls back within the regulated range.

However, if the short circuit signal is established between location 1 and a second node electrically connected to ground causing the output voltage to exceed the regulated range of 1.3V±0.5% and the VRM 201 does not adjust accordingly to bring the output voltage back within the regulated range, it can be determined that the VRM is malfunctioning. For example, some possible malfunctions can be that the master controller 202 can not recognize that the output voltage is exceeding the regulated range, the redundancy controller 210 can not execute the instructions from the master controller to disconnect phase 1 from the VRM, the master controller can not redistribute the total current properly amongst the remaining phases, or the power stage 216 is malfunctioning.

This is only an example of testing and monitoring a VRM by using a failure inducing condition. There can be other failure inducing conditions. There can also be other methods of establishing a failure inducing short circuit between a first node electrically connected to the input voltage 222 and a second node electrically connected to ground and causing the voltage supplied to regulator 1 to reduce to 0 V. Furthermore, there can be other methods of monitoring the VRM when the failure condition is induced. For instance, the total current that is distributed amongst the remaining phases can be read by a detection circuit. The current can then be monitored to determine if the master controller 202 adequately instructed the redundancy controller 210 to disconnect phase 1 from the VRM and redistribute the total current so that the VRM continued to have an output voltage 244 that was in the regulated range. Other phases can also be tested in the VRM. For instance, the set of low-impedance pins can also be electrically connected to nodes that are electrically connected to the input voltage 224 of phase 2 or the input voltage 226 of phase n. The output voltage 244, current, power, etc., can then be monitored to determine if the DC/DC converter 301 is working properly.

In various embodiments, the failure inducing condition can be a short circuit established between nodes that are electrically connected to an output voltage and ground. For instance, a set of low-impedance pins can be electrically connected to a first node that is electrically connected to the output voltage 244. Also, the set of low-impedance pins can be electrically connected to a second node that is electrically connected to ground (not shown in FIG. 2). Furthermore, a low-impedance cross bar can electrically connect the set of low-impedance pins to establish the short circuit between the first and second node. As illustrated, location 2 in phase 1 of FIG. 2, is a node that is electrically connected to output voltage 244. By establishing a short circuit between location 2 and ground, phase 1 can be induced to fail. The VRM 201 and its elements can operate as described in the example where the short circuit was established between location 1 and a second node electrically connected to ground. The VRM 201 and its elements can then be tested and monitored with the short circuit between location 2 and a second node electrically connected to ground similar to the example where the short circuit was established between location 1 and a second node electrically connected to ground. It can then be determined whether the VRM 201 and its elements are working properly.

In another embodiment, the failure inducing condition can be a short circuit established between nodes that are electrically connected to a control voltage and ground. For instance, a set of low-impedance pins can be electrically connected to a first node that is electrically connected to control voltages 228, 230, or 232. Also, the set of low-impedance pins can be electrically connected to a second node that is electrically connected to ground (not shown in FIG. 2). Furthermore, a low-impedance cross bar can electrically connect the set of low-impedance pins to establish the short circuit between the first and second node. As illustrated, location 3 in phase 1 of FIG. 2, is a node that is electrically connected to control voltage 228. By establishing a short circuit between location 3 and ground, phase 1 can be induced to fail. The VRM 201 and its elements can operate as described in the example where the short circuit was established between location 1 and a second node electrically connected to ground. The VRM 201 and its elements can then be tested and monitored with the short circuit between location 3 and a second node electrically connected to ground similar to the example where the short circuit was established between location 1 and a second node electrically connected to ground. It can then be determined whether the VRM 201 and its elements are working properly.

In certain embodiments, the failure inducing condition can be a noise signal transmitted between a power device and a logic device. For instance, the noise signal can be transmitted at a node that is electrically connected to power stage 216, 218, or 220 and to redundancy controller 210, 212, or 214. As illustrated, location 4 phase 2 of FIG. 2, is a node that is electrically connected to redundancy controller 212 and power conversion stage 218. Furthermore, a noise signal can be transmitted at location 4 to induce phase 2 to fail. The VRM 201 and its elements can operate as described in the example where the short circuit was established between location 1 and a second node electrically connected to ground. The VRM and its elements can then be tested and monitored with the noise signal transmitted at location 4 similar to the example where the short circuit was established between location 1 and a second node electrically connected to ground. It can then be determine whether the VRM and its elements are working properly.

In various embodiments, the failure inducing condition can be a noise signal transmitted between a master controller and a logic device. For instance, the noise signal can be transmitted at a node that is electrically connected to master controller 202 and to redundancy controller 210, 212, or 214. As illustrated, location 5 in phase 2 of FIG. 2, is a node that is electrically connected to redundancy controller 212 and master controller 202. Furthermore, a noise signal can be transmitted at location 5 to induce phase 2 to fail. The VRM 201 and its elements can operate as described in the example where the short circuit was established between location 1 and a second node electrically connected to ground. The VRM and its elements can then be tested and monitored with the noise signal transmitted at location 5 similar to the example where the short circuit was established between location 1 and a second node electrically connected to ground. It can then be determine whether the VRM and its elements are working properly.

In another embodiment, the failure inducing condition can be a faulty communication path between a power device and a logic device. For example, communication paths between power devices and logic devices can be short circuited by electrically connecting a set of low-impedance pins to a first node that is electrically connected to power stages 216, 218, or 220 and redundancy controllers 210, 212, or 214. Also, the set of low-impedance pins can be electrically connected to a second node that is electrically connected to ground (not shown in FIG. 2). Furthermore, a low-impedance cross bar can electrically connect the set of low-impedance pins to establish the short circuit between the first and second node. As illustrated, location 6 in phase n of FIG. 2, is a node that is electrically connected to power stage 220 and redundancy controller 214. By establishing a short circuit between location 6 and ground, phase n can be induced to fail. The VRM 201 and its elements can operate as described in the example where the short circuit was established between location 1 and a second node electrically connected to ground. Furthermore, the VRM and its elements can be tested and monitored with the short circuit between location 6 and a second node electrically connected to ground similar to the example where the short circuit was established between location 1 and a second node electrically connected to ground. It can then be determined whether the VRM and its elements are working properly.

In certain embodiments, the failure inducing condition can be a faulty communication path between a master controller and a logic device. For example, communication paths between master controllers and logic devices can be short circuited by electrically connecting a set of low-impedance pins to a first node that is electrically connected to master controller 202 and redundancy controllers 210, 212, or 214. Also, the set of low-impedance pins can be electrically connected to a second node that is electrically connected to ground (not shown in FIG. 2). Furthermore, a low-impedance cross bar can electrically connect the set of low-impedance pins to establish the short circuit between the first and second node. As illustrated, location 7 in phase n of FIG. 2, is a node that is electrically connected to master controller 202 and redundancy controller 214. By establishing a short circuit between location 7 and ground, phase n can be induced to fail. The VRM 201 and its elements can operate as described in the example where the short circuit was established between location 1 and a second node electrically connected to ground. Furthermore, the VRM and its elements can be tested and monitored with the short circuit between location 7 and a second node electrically connected to ground similar to the example where the short circuit was established between location 1 and a second node electrically connected to ground. It can then be determined whether the VRM and its elements are working properly.

Figure 3:
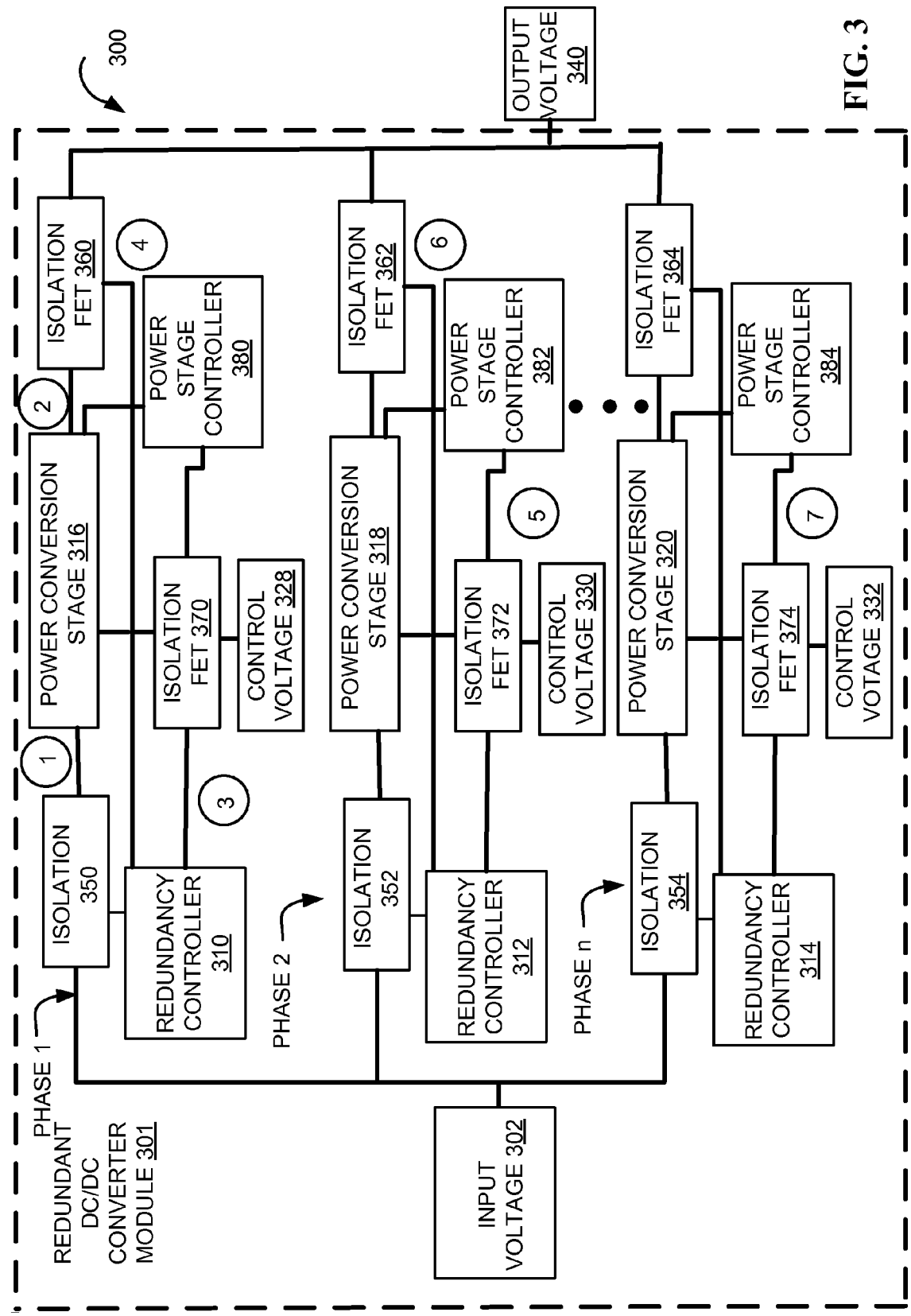
FIG. 3 depicts an example of a circuit with a redundant direct current to direct current (DC/DC) converter module capable of receiving failure inducing conditions, consistent with embodiments of the present disclosure.

FIG. 3 depicts an example of a circuit 300 with a redundant direct current to direct current (DC/DC) converter module capable of receiving failure inducing conditions, consistent with embodiments of the present disclosure. As shown, the circuit 300 can include a DC/DC converter 301 and output voltage 340. The DC/DC converter 301 can be configured to include an input voltage 302, power stage controllers 380, 382, 384, redundancy controllers 310, 312, 314, power conversion stages 316, 318, 320, isolation switches 350, 352, 354, isolation FETs 360, 362, 364, 370, 372, 374, and control voltages 328, 330, 332.

Input voltage 302 and control voltages 328, 330, 332 can be configured to operate similar to voltage sources 102, 104, 106 from FIG. 1. Power stage controllers 380, 382, and 384 can be configured to operate similar to master controller 140 from FIG. 1. Redundancy controllers 310, 312, and 314 can be configured to operate similar to logic devices 108, 110, and 112 from FIG. 1. Power conversion stages 316, 318, and 320 can be configured to operate similar to power devices 114, 116, and 118 from FIG. 1. Isolation switches 350, 352 and 354 can be configured to operate similar to isolation switches 134, 136, and 138 from FIG. 1. Isolation FETs 360, 362, 364, 370, 372, 374, 380, 382, and 384 can be configured to operate similar to isolation FETs 120, 122, 124, 128, 130, and 132 from FIG. 1. Output voltage 340 can be configured to operate similar to output voltage 126 from FIG. 1.

In various embodiments, power stage controllers 380, 382, and 384 can provide the necessary logic that determines how current flowing through DC/DC converter 301 is divided amongst regulator 1-regulator n. For instance, the power stage controllers 380, 382, and 384 can be responsible for evenly distributing the total current between the regulator 1-regulator n so an equal amount of current is carried by each regulator. Additionally, if a regulator is disconnected, the power stage controllers can be responsible for distributing the total current between the remaining connected regulators.

In an embodiment, a failure condition that modifies the operating parameters of a regulator can be induced in the regulator of the DC/DC converter 301. The failure condition can be a short circuit established between nodes electrically connected to an input voltage and ground. For instance, a set of low-impedance pins (not shown in FIG. 3) can be electrically connected at a first node that is electrically connected to the input voltage 302. Also, the set of low-impedance pins can be electrically connected to a second node that is electrically connected to ground (not shown in FIG. 3). Furthermore, a low-impedance cross bar can electrically connect the set of low-impedance pins to establish the short circuit between the first and second node.

The power stage controllers 380, 382, and 384 can be configured to distribute current evenly between regulator 1-regulator n. The regulators can be of similar design so that when current is evenly distributed, each regulator will supply 1/n of the total power output. However, this is just one example of current distribution and the power stage controllers can distribute current so that some regulators carry more current than other regulators. Furthermore, the power stage controllers can be configured to maintain an output voltage 340 of 1.3 V with an error of ±0.5%.

As illustrated, location 1 in regulator 1 of FIG. 3, is a node that is electrically connected to input voltage 302 and can be the first node where the set of low-impedance pins are connected. When a short circuit is established between location 1 and a second node electrically connected to ground, the voltage supplied to regulator 1 reduces to 0 V. Consequentially, the output voltage 340 can be read by a detection circuit and can exceed the regulated range of 1.3V±0.5%. The power stage controller 380 can monitor the output voltage 340 and recognize that the output voltage has exceeded the regulated range. The power stage controller 380 can then determine that the output voltage is exceeding the regulated range because the voltage supplied to regulator 1 is 0 V. The power stage controller can then instruct the redundancy controller 310 to disconnect regulator 1 from the DC/DC converter 301 by opening the isolation switch 350 and activating the isolation FETs 360 and 370. The power stage controllers 382 and 384 can then distribute current evenly amongst the regulators still connected within the DC/DC converter, i.e. regulator 2-regulator n. The power stage controllers 382 and 384 can then monitor the output voltage to determine if the output voltage falls back within the regulated range. If the output voltage does fall back within the regulated range, the power stage controllers 382 and 384 can continue distributing the current accordingly to the remaining regulators. If the output voltage does not fall back within the regulated range, the power stage controllers 382 and 384 can redistribute the current amongst the remaining regulators and then determine if the output voltage falls back within the regulated range.

However, if the short circuit is established between location 1 and a second node electrically connected to ground, causing the output voltage to exceed the regulated range of 1.3V±0.5% and the DC/DC converter 301 does not adjust accordingly to bring the output voltage back within the regulated range, it can be determined that the DC/DC converter is malfunctioning. For example, some possible malfunctions can be that the power stage controller 380 can not recognize that the output voltage is exceeding the regulated range, the redundancy controller 310 can not execute the instructions from the power stage controller 380 to disconnect regulator 1 from the DC/DC converter, the power stage controllers 382 and 384 can not redistribute the current amongst the remaining regulators, or the power conversion stage 316 is malfunctioning.

This is only an example of testing and monitoring a DC/DC converter by using a failure inducing condition. There can be other failure inducing conditions. There can also be other methods of establishing a failure inducing short circuit between a first node electrically connected to the input voltage 302 and a second node electrically connected to ground and causing the voltage supplied to regulator 1 to reduce to 0 V. Furthermore, there can be other methods of monitoring the DC/DC converter when the failure condition is induced. For instance, the current that is distributed amongst the remaining regulators can be read by a detection circuit. The current can then be monitored to determine if the power stage controller 380 adequately instructed the redundancy controller 310 to disconnect regulator 1 from the DC/DC converter and power stage controllers 382 and 384 redistributed the current so that the DC/DC converter continued to have an output voltage 340 that was in the regulated range. Other regulators can also be tested in the DC/DC converter. For instance, the set of low-impedance pins can also be electrically connected to nodes that are electrically connected to the input voltage 302 and regulator 2-regulator n. The output voltage 340, current, power, etc., can then be monitored to determine if the DC/DC converter 301 is working properly.

In various embodiments, the failure inducing condition can be a short circuit established between nodes that are electrically connected to an output voltage and ground. For instance, a set of low-impedance pins can be electrically connected to a first node that is electrically connected to the output voltage 340. Also, the set of low-impedance pins can be electrically connected to a second node that is electrically connected to ground (not shown in FIG. 3). Furthermore, a low-impedance cross bar can electrically connect the set of low-impedance pins to establish the short circuit between the first and second node. As illustrated, location 2 in regulator 1 of FIG. 3, is a node that is electrically connected to output voltage 340. By establishing a short circuit between location 2 and ground, regulator 1 can be induced to fail. The DC/DC converter 301 and its elements can operate as described in the example where the short circuit was established between location 1 and a second node electrically connected to ground. The DC/DC converter 301 and its elements can then be tested and monitored with the short circuit between location 2 and a second node electrically connected to ground similar to the example where the short circuit was established between location 1 and a second node electrically connected to ground. It can then be determined whether the DC/DC converter 301 and its elements are working properly.

In another embodiment, the failure inducing condition can be a short circuit established between nodes that are electrically connected to a control voltage and ground. For instance, a set of low-impedance pins can be electrically connected to a first node that is electrically connected to control voltages 328, 330, or 332. Also, the set of low-impedance pins can be electrically connected to a second node that is electrically connected to ground (not shown in FIG. 3). Furthermore, a low-impedance cross bar can electrically connect the set of low-impedance pins to establish the short circuit between the first and second node. As illustrated, location 3 in regulator 1 of FIG. 3, is a node that is electrically connected to control voltage 328. By establishing a short circuit between location 3 and ground, regulator 1 can be induced to fail. The DC/DC converter 301 and its elements can operate as described in the example where the short circuit was established between location 1 and a second node electrically connected to ground. The DC/DC converter 301 and its elements can then be tested and monitored with the short circuit between location 3 and a second node electrically connected to ground similar to the example where the short circuit was established between location 1 and a second node electrically connected to ground. It can then be determined whether the DC/DC converter 301 and its elements are working properly.

In certain embodiments, the failure inducing condition can be a noise signal transmitted between a power device and a logic device. For instance, the noise signal can be electrically connected at a node that is electrically connected to power conversion stage 316, 318, or 320 and to redundancy controller 310, 312, or 314. As illustrated, location 4 in regulator 1 of FIG. 3, is a node that is electrically connected to redundancy controller 310 and power conversion stage 316. Furthermore, a noise signal can be transmitted at location 4 to induce regulator 1 to fail. The DC/DC converter and its elements can operate as described in the example where the short circuit was established between location 1 and a second node electrically connected to ground. The DC/DC converter and its elements can then be tested and monitored with the noise signal transmitted at location 4 similar to the example where the short circuit was established between location 1 and a second node electrically connected to ground. It can then be determine whether the DC/DC converter and its elements are working properly.

In various embodiments, the failure inducing condition can be a noise signal transmitted between a master controller and a logic device. For instance, the noise signal can be electrically connected at a node that is electrically connected to power stage controller 380, 382, or 384 and to redundancy controller 310, 312, or 314. As illustrated, location 5 in regulator 2 of FIG. 3, is a node that is electrically connected to redundancy controller 312 and power stage controller 382. Furthermore, a noise signal can be transmitted at location 5 to induce regulator 2 to fail. The DC/DC converter and its elements can operate as described in the example where the short circuit was established between location 1 and a second node electrically connected to ground. The DC/DC converter and its elements can then be tested and monitored with the noise signal transmitted at location 5 similar to the example where the short circuit was established between location 1 and a second node electrically connected to ground. It can then be determine whether the DC/DC converter and its elements are working properly.

In another embodiment, the failure inducing condition can be a faulty communication path between a power device and a logic device. For example, communication paths between power devices and logic devices can be short circuited by electrically connecting a set of low-impedance pins to a first node that is electrically connected to power conversion stages 316, 318, or 320 and redundancy controllers 310, 312, or 314. Also, the set of low-impedance pins can be electrically connected to a second node that is electrically connected to ground (not shown in FIG. 3). Furthermore, a low-impedance cross bar can electrically connect the set of low-impedance pins to establish the short circuit between the first and second node. As illustrated, location 6 in regulator 2 of FIG. 3, is a node that is electrically connected to power conversion stage 318 and redundancy controller 312. By establishing a short circuit between location 6 and ground, regulator 2 can be induced to fail. The DC/DC converter 301 and its elements can operate as described in the example where the short circuit was established between location 1 and a second node electrically connected to ground. Furthermore, the DC/DC converter 301 and its elements can be tested and monitored with the short circuit between location 6 and a second node electrically connected to ground similar to the example where the short circuit was established between location 1 and a second node electrically connected to ground. It can then be determined whether the DC/DC converter 301 and its elements are working properly.

In certain embodiments, the failure inducing condition can be a faulty communication path between a master controller and a logic device. For example, communication paths between master controllers and logic devices can be short circuited by electrically connecting a set of low-impedance pins to a first node that is electrically connected to power stage controllers 380, 382, or 384 and redundancy controllers 310, 312, or 314. Also, the set of low-impedance pins can be electrically connected to a second node that is electrically connected to ground (not shown in FIG. 3). Furthermore, a low-impedance cross bar can electrically connect the set of low-impedance pins to establish the short circuit between the first and second node. As illustrated, location 7 in regulator n of FIG. 3, is a node that is electrically connected to power stage controller 384 and redundancy controller 314. By establishing a short circuit between location 7 and ground, regulator n can be induced to fail. The DC/DC converter 301 and its elements can operate as described in the example where the short circuit was established between location 1 and a second node electrically connected to ground. Furthermore, the DC/DC converter 301 and its elements can be tested and monitored with the short circuit between location 7 and a second node electrically connected to ground similar to the example where the short circuit was established between location 1 and a second node electrically connected to ground. It can then be determined whether the DC/DC converter 301 and its elements are working properly.

FIG. 4A depicts an example of a VRM 400 configured to receive failure inducing conditions, consistent with embodiments of the present disclosure. Consistent with embodiments, VRM 400 can include a printed circuit board (PCB) loaded with various circuits. The PCB can include a variety of connection points designed to interface with pins of a test system.

As shown, VRM 400 can include a master controller 402, a master controller connection point 404, isolation FETs 406, 416, a redundancy controller 408, a redundancy controller connection point 410, a power stage 412, a power stage connection point 414, an input voltage connection point 420, and a ground connection point 422.

Master controller 402 can be configured to operate similar to master controller 104 from FIG. 1. Redundancy controller 408 can be configured to operate similar to logic devices 108, 110, and 112 from FIG. 1. Power stage 412 can be configured to operate similar to power devices 114, 116, and 118 from FIG. 1. Isolation FETs 406, 416 can be configured to operate similar to isolation FETs 120, 122, 124, 128, 130, and 132 from FIG. 1.

FIG. 4B depicts an example of low-impedance pins and a cross bar configured to establish a short circuit, consistent with embodiments of the present disclosure. As shown, the configuration can include a first low-impedance pin 436, a second low-impedance pin 438, and a low-impedance cross bar 440. As illustrated, the VRM 430 can include a first connection point 432 and a second connection point 434. Furthermore, VRM 430 can be configured to have the characteristics of VRM 400.

In an embodiment, the first low-impedance pin 436 can electrically connect to the first connection point 432 and the second low-impedance pin 438 can electrically connect to the second connection point 434. The first connection point 432 and second connection point 434 can be configured to have the characteristics of the connection points 404, 410, 414, 420, and 422, from FIG. 4A. For example, the first connection point 432 can be the input voltage connection point 420 and the second connection point 438 can be the ground connection point 422. The input voltage connection point 420 can be electrically connected to an input voltage as described herein in regard to FIG. 2 and FIG. 3. The ground connection point 422 can be electrically connected to ground as described herein in regard to FIG. 2 and FIG. 3. Furthermore, the low-impedance cross bar 440, from FIG. 4B, can establish a short circuit connection between the first low-impedance pin 436 and the second low-impedance pin 438. This can establish a short circuit connection between the input voltage and ground. The VRM 430 and its elements can operate as described herein, in regard to FIG. 2 and FIG. 3. Furthermore, the VRM 430 and its elements can be tested and monitored with the short circuit between the input voltage and ground similar to FIG. 2 and FIG. 3 where the short circuit was established between an input voltage and ground to determine whether the VRM and its elements are working properly.

Other examples can be carried out by electrically connecting the first low-impedance pin 436 to another connection point, e.g., connection points 404, 410, 414, and 422, and electrically connecting the second low-impedance pin 438 to another connection, e.g. connection points 404, 410, 414, and 420. In addition, other failure inducing conditions may be produced, such as a noise signal or a communication disturbance signal. Also, the failure inducing condition can be transmitted without the use of the low-impedance cross bar 440. Furthermore, a different signal, such as a communication disturbance signal, can be generated using the low-impedance cross bar 440 by establishing a short circuit connection between the first low-impedance pin 436 and the second low-impedance pin 438.

Figure 5:
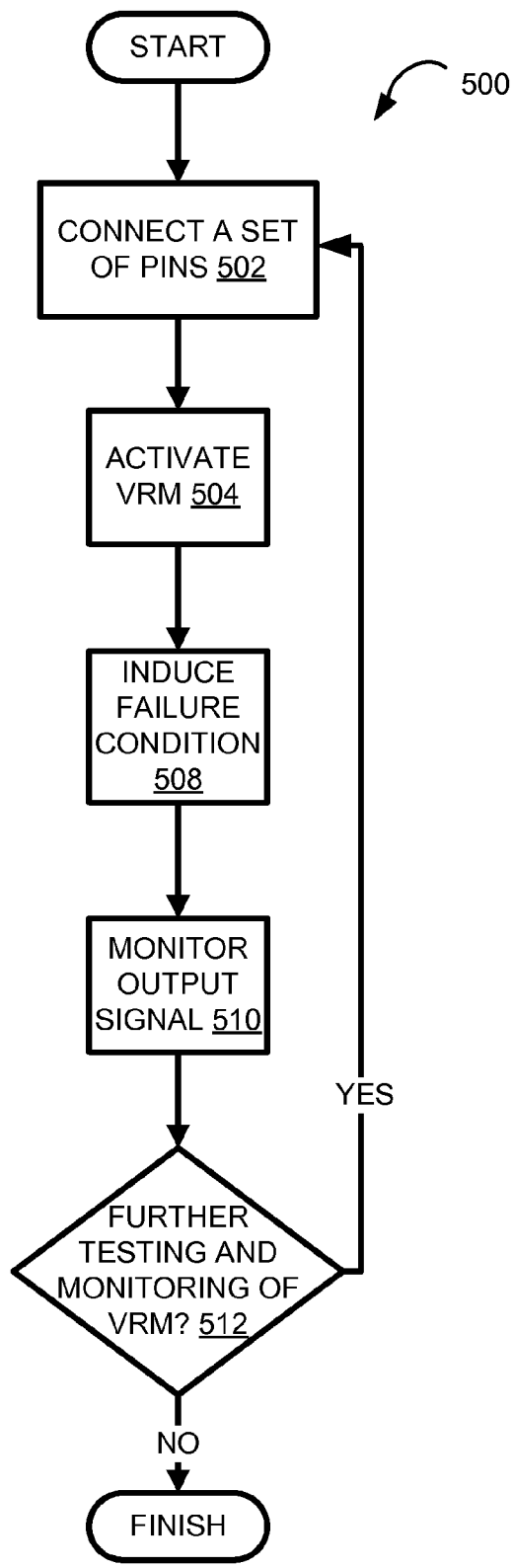
FIG. 5 depicts a method 500 for testing functionality of a multi-phase voltage regulator module (VRM), consistent with embodiments of the present disclosure.

FIG. 5 depicts a method 500 for testing functionality of a multi-phase voltage regulator module (VRM), consistent with embodiments of the present disclosure. In operation 502, a set of low-impedance pins are electrically connected to a set of corresponding nodes of a multi-phase VRM. The nodes can be electrically connected to elements of the VRM such as a master controller, a logic device, or a power device. The set of low-impedance pins can create a failure inducing condition that can cause a phase or phases of the VRM to fail. For example, the failure condition can be a short circuit established between nodes electrically connected to an input voltage of the VRM and ground. In another example, the failure condition can be a noise signal or a faulty communication path.

In operation 504, the VRM is activated. In operation 508, the failure condition that modifies the operating parameters of a phase can be induced within the VRM. The signal can induce failure in a phase of the multi-phase VRM. In operation 510, an output signal can be monitored. As stated herein, a VRM can be configured as a closed-loop system. For a closed-loop system, a sensor monitors the system output and feeds data to a controller which adjusts the control as necessary to maintain the desired system output. If failure is induced within a phase of the VRM, the VRM can redistribute current accordingly so the output signal of the VRM remains in a regulated range. However, if the current is not redistributed properly, a malfunction within the VRM can be detected and the detection can be made based on the output signal.

In operation 512, further testing and monitoring of the VRM is determined. If further testing needs to be done, the set of low-impedance pins are electrically connected to a different set of corresponding nodes of the multi-phase VRM or a different failure inducing condition can be applied to the same nodes.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for testing functionality of a multi-phase voltage regulator module (VRM), the method comprising:
connecting, electrically, a set of low-impedance pins to a set of corresponding nodes of the multi-phase VRM, wherein the set of low-impedance pins is configured to induce a failure condition in a phase of the multi-phase VRM;
activating the multi-phase VRM;
inducing a failure condition in the phase of the multi-phase VRM by modifying operating parameters of the phase of the multi-phase VRM using the set of low-impedance pins, wherein modifying operating parameters includes generating a short circuit between two nodes from the set of nodes, the two nodes being located in the phase of the multi-phase VRM; and
monitoring an output signal of the multi-phase VRM in response to the induced failure condition, wherein monitoring the output signal comprises receiving the output signal and determining the multi-phase VRM is malfunctioning based on the output signal.

2. The method of claim 1, wherein the short circuit is generated between a first node that is electrically connected to a voltage source and a second node that is electrically connected to a ground.

3. The method of claim 2, wherein the short circuit is established by electrically connecting the set of low-impedance pins to one another using a low-impedance cross bar.

4. The method of claim 1, wherein the short circuit is generated between a first node that is electrically connected to an output voltage and a second node that is electrically connected to a ground.

5. The method of claim 1, wherein the two nodes include a first node that is electrically connected to a power device and a second node that is electrically connected to a logic device, and wherein inducing the failure condition includes generating a noise signal between the first and second nodes.

6. The method of claim 1, wherein the two nodes include a first node that is electrically connected to a master controller and a second node that is electrically connected to a logic device, and wherein inducing the failure condition includes generating a noise signal between the first and second nodes.

7. The method of claim 1, wherein the two nodes include a first node that is electrically connected to a power device and a second node is electrically connected to a logic device, and wherein inducing the failure condition includes generating a faulty communication path between the first and second nodes.

8. The method of claim 1, wherein the two nodes include a first node that is electrically connected to a master controller and a second node is electrically connected to a logic device, and wherein inducing the failure condition includes generating a faulty communication path between the first and second nodes.

9. The method of claim 1, wherein the multi-phase VRM includes an isolation switch, wherein an output of the isolation switch is connected to an input of a redundancy controller, wherein an output of the redundancy controller is connected to an input of a power stage, wherein an output of the power stage is connected to an input of an isolation field-effect transistor (FET), wherein an output of the isolation FET is connected to an input of an input voltage and an input of a supply voltage, and wherein the short circuit between two nodes from the set of nodes is between a first node electrically connected to the isolation FET and a second node electrically connected to the redundancy controller.

10. The method of claim 1, wherein the short circuit between two nodes from the set of nodes is between a first node electrically connected to a power conversion stage and a second node electrically connected to a second isolation FET.

11. A system for testing functionality of a multi-phase voltage regulator module (VRM), the system comprising:
a set of low-impedance pins configured to:
connect, electrically, to a set of corresponding nodes of a multi-phase VRM, and
induce a failure condition in a phase of the multi-phase VRM, when the multi-phase VRM has been activated, by modifying operating parameters of the phase of the multi-phase VRM; and
a detection circuit configured to monitor an output signal of the activated multi-phase VRM in response to the induced failure condition.

12. The system of claim 11, wherein monitoring the output signal comprises:
receiving the output signal; and
determining the multi-phase VRM is malfunctioning based on the output signal.

13. The system of claim 11, wherein the induced failure condition is a short circuit between two nodes from the set of nodes that are electrically connected to a voltage source and ground, respectively.

14. The system of claim 11, wherein the induced failure condition is a short circuit between two nodes from the set of nodes that are electrically connected to an output voltage and ground, respectively.

15. The system of claim 14, further comprising:
a low-impedance cross bar configured to established an electrical connection between the set of low-impedance pins.

16. The system of claim 11, wherein the induced failure condition is a noise signal and the set of nodes is electrically connected to a power device and a logic device.

17. The system of claim 11, wherein the induced failure condition is a noise signal and the set of nodes is electrically connected to a master controller and a logic device.

18. The system of claim 11, wherein the induced failure condition is a faulty communication path between a power device and a logic device.

19. The system of claim 11, wherein the induced failure condition is a faulty communication path between a master controller and a logic device.

20. The system of claim 11, wherein the multi-phase VRM includes a redundant direct current to direct current (DC/DC) converter module, wherein the DC/DC converter module includes one or more isolation switches, one or more redundancy controllers, one or more power conversion stages, one or more isolation FETs, one or more control voltages, and one or more power stage controllers, and wherein the failure condition in the phase of the multi-phase VRM is between a redundancy controller and a power stage controller.

* * * * *